United States Patent
Kang et al.

(10) Patent No.: US 8,283,768 B2
(45) Date of Patent: Oct. 9, 2012

(54) WAFER LEVEL PACKAGE FOR HEAT DISSIPATION AND METHOD OF MANUFACTURING THE SAME

(75) Inventors: Joon Seok Kang, Gyunggi-do (KR); Sung Yi, Gyunggi-do (KR); Young Do Kweon, Seoul (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 297 days.

(21) Appl. No.: 12/424,514

(22) Filed: Apr. 15, 2009

(65) Prior Publication Data

US 2010/0193932 A1 Aug. 5, 2010

(30) Foreign Application Priority Data

Feb. 5, 2009 (KR) .................. 10-2009-0009369

(51) Int. Cl.
*H01L 23/48* (2006.01)
*H01L 23/52* (2006.01)

(52) U.S. Cl. .................. 257/690; 257/706; 257/712
(58) Field of Classification Search .................. 257/690, 257/712
See application file for complete search history.

(56) References Cited

U.S. PATENT DOCUMENTS

2003/0134455 A1 7/2003 Cheng et al.
2008/0150164 A1* 6/2008 Chia .................. 257/783

FOREIGN PATENT DOCUMENTS

| JP | 2007-250868 | 9/2007 |
| JP | 2008-047573 | 2/2008 |
| KR | 1019990013776 | 2/1999 |

OTHER PUBLICATIONS

Office Action from counterpart Korean Patent Application No. 10-2009-0009369 Sep. 15, 2010, 6 pages.

* cited by examiner

*Primary Examiner* — Thien F Tran
(74) *Attorney, Agent, or Firm* — Blakely Sokoloff Taylor & Zafman LLP

(57) ABSTRACT

Disclosed herein are a wafer level package for heat dissipation and a method of manufacturing the same. The wafer level package includes a heat dissipation plate including a cavity and a hole, a die including a pad disposed in the cavity of the heat dissipation plate in a face-up manner, a thermal conductive adhesive disposed between the die and an inner wall of the cavity and disposed in the hole, and a redistribution layer connected at one end to the pad and at the other end extended. The wafer level package protects the die from external environments and enables the die to be easily flush with the heat dissipation plate.

6 Claims, 11 Drawing Sheets

WAFER LEVEL PACKAGE FOR HEAT DISSIPATION AND METHOD OF MANUFACTURING THE SAME

CROSS REFERENCE TO RELATED APPLICATION

This application claims the benefit of Korean Patent Application No. 10-2009-0009369, filed Feb. 5, 2009, entitled "Wafer level package for heat dissipating and fabricating method of the same", which is hereby incorporated by reference in its entirety into this application.

BACKGROUND OF THE INVENTION

1. Field of the Invention

The present invention relates to a wafer level package for heat dissipation and a method of manufacturing the same.

2. Description of the Related Art

A wafer level chip scale package (WLCSP), which is a package prepared before being cut into individual dies, is manufactured in such a way that a wafer is simultaneously subjected to collective processes of forming redistribution layers and solder balls at a wafer level and the wafer including the solder balls thereon is cut into chips. In the manufacture of the wafer level chip scale package, redistribution or rerouting of pads of the dies is employed.

Recently, in electronic component industries, the number of I/Os of a chip is continuously increased and wafer packages are increasingly becoming multifunctional and complicated. In accordance with this trend, research into improving heat dissipation performance of a wafer level chip scale package is being intensively conducted.

FIGS. 1 to 6 show a conventional process of manufacturing a wafer level package including a heat dissipation plate in the process sequence. Hereinafter, the process of manufacturing a wafer level package will be briefly described.

As shown in FIG. 1, a heat dissipation plate 12 for improving heat dissipation performance is first prepared.

As shown in FIG. 2, a cavity 14 which is adapted to allow a die to be inserted therein is formed in the heat dissipation plate 12.

As shown in FIG. 3, a die 16 which includes pads 18 disposed on a side thereof is aligned so as to be mounted in the cavity 14.

As shown in FIG. 4, the die 16 is mounted in the cavity using an adhesive 20. More specifically, the die 16 is mounted in the cavity 14 using an adhesive 20 disposed between a lateral wall of the die 16 and an inner wall of the cavity 14.

As shown in FIG. 5, a buildup layer 22 having a circuit layer 26 and an insulating layer 24 is disposed on the heat dissipation plate 12 and the die 16 such that the circuit layer 26 is connected to the pads 18.

As shown in FIG. 6, a solder resist layer 28 having openings is disposed on the outermost surface of the buildup layer 22 such that land parts of the circuit layer 26 are exposed through the openings of the solder resist layer 28, and solder balls 30 are attached to the land parts, thus providing a wafer level package 10.

However, the conventional wafer level package 10 has trouble in that the back side of the die is exposed to the outside and is thus damaged by the external environments, and it is hard to make the heat dissipation plate 12 flush with the die at a desired height. In particular, although the side of the die 16 on which the pads 18 are disposed is shown in FIG. 4 as being flush with the heat dissipation plate 12, there may be a height difference between the die 16 and the heat dissipation plate 12 in an actual manufacturing process. When a height difference is present between the die 16 and the heat dissipation plate 12, an additional insulating layer 24 must be first formed on one side of the die 16 so as to allow easy formation of the circuit layer 26.

SUMMARY OF THE INVENTION

Accordingly, the present invention has been made keeping in mind the above problems occurring in the related art, and the present invention provides a wafer level package for heat dissipation which is adapted to protect a die from an external environment and to enable the die and a heat dissipation plate to easily be made flush with each other, and a method of manufacturing the same.

In one aspect, the present invention provides a wafer level package for heat dissipation including: a heat dissipation plate including a cavity and a hole formed therein; a die including a pad disposed in the cavity of the heat dissipation plate in a face-up manner; a thermal conductive adhesive disposed between the die and an inner wall of the cavity and disposed in the hole; and a redistribution layer connected at one end to the pad and which at the other end is extended.

The wafer level package may further include: a solder resist layer formed on the die and having an opening through which the other end of the redistribution layer is extended; and an external connection terminal formed on the other end of the redistribution layer.

The hole may be formed through the heat dissipation plate.

The hole may include a plurality of holes formed in the heat dissipation plate.

The hole may be formed at a periphery of the heat dissipation plate and has a sector section.

The hole may have a quadrangular section in which adjacent sides of the quadrant, which correspond to a radius of the hole, define a right angle with respect to each other.

In another aspect, the present invention provides a method of manufacturing a wafer level package for heat dissipation, including: (A) attaching a die having a pad to a support plate; (B) forming a cavity and a hole in a heat dissipation plate; (C) attaching the heat dissipation plate to the support plate using a thermal conductive adhesive such that the die is inserted in the cavity of the heat dissipation plate; and (D) removing the support plate and forming a redistribution layer on the die in which the redistribution layer is connected at one end to the pad of the die and at the other end is extended.

The (A) attaching the die may include: (A1) forming an alignment mark on the support plate; (A2) forming a transparent sacrifice layer in a semicured state on the support plate including the alignment mark formed thereon; and (A3) aligning the die using the alignment mark formed on the support plate and attaching the die to the support plate in a face-down manner through the sacrifice layer.

In the (B) forming the cavity and the hole, the hole may be formed through the heat dissipation plate.

In the (B) forming the cavity and the hole, the hole may include a plurality of holes formed in one package unit having one die.

In the (B) forming the cavity and the hole, the hole may include holes formed at four corners of the heat dissipation plate respectively, and each of the holes may have a sector section.

Each of the holes may have a quadrangular section in which adjacent sides of the quadrant, which correspond to a radius of the hole, define a right angle with respect to each other.

The holes may be formed on scribing lines defining the package unit.

In the (C) attaching the heat dissipation plate, the thermal conductive adhesive may be applied onto the die so that the thermal conductive adhesive infiltrates between the die and an inner wall of the cavity and in the hole and thus the heat dissipation plate is attached to the support plate.

In the (C) attaching the heat dissipation plate, the heat dissipation plate may be aligned with the support plate so as to allow the die to be inserted in the cavity, and the thermal conductive adhesive may be injected through the hole of the heat dissipation plate so that the thermal conductive adhesive infiltrates between the die and an inner wall of the cavity and in the hole and thus the heat dissipation plate is attached to the support plate.

The injection of the thermal conductive adhesive may be performed while air present between the die and an inner wall of the cavity and in the hole is discharged through another hole through which the injection is not performed.

The method may further include, after the (D) removing the support plate and forming the redistribution layer: (E) forming a solder resist layer on the die, the solder resist layer having an opening through which the other end of the redistribution layer is exposed; (F) forming an external terminal on the other end of the redistribution layer which is exposed through the opening of the solder resist layer; and (G) singulating a multi-package into the wafer level package unit including one die therein by cutting along a scribing line formed between the package units.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
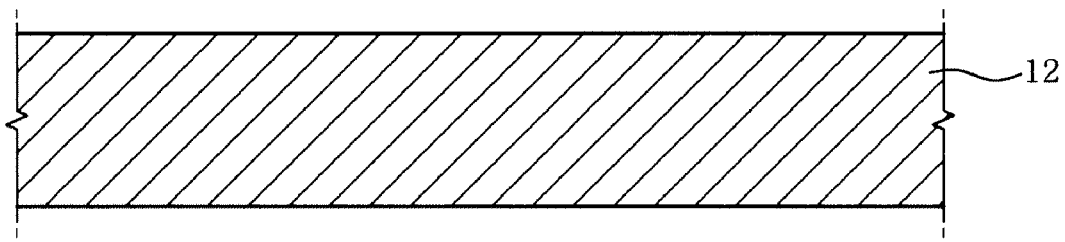
FIGS. 1 to 6 show a conventional process of manufacturing a wafer level package including a heat dissipation plate in the process sequence.
Figure 2:
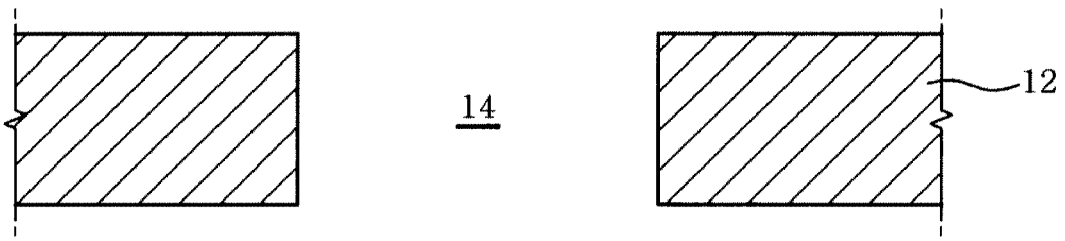
Figure 3:
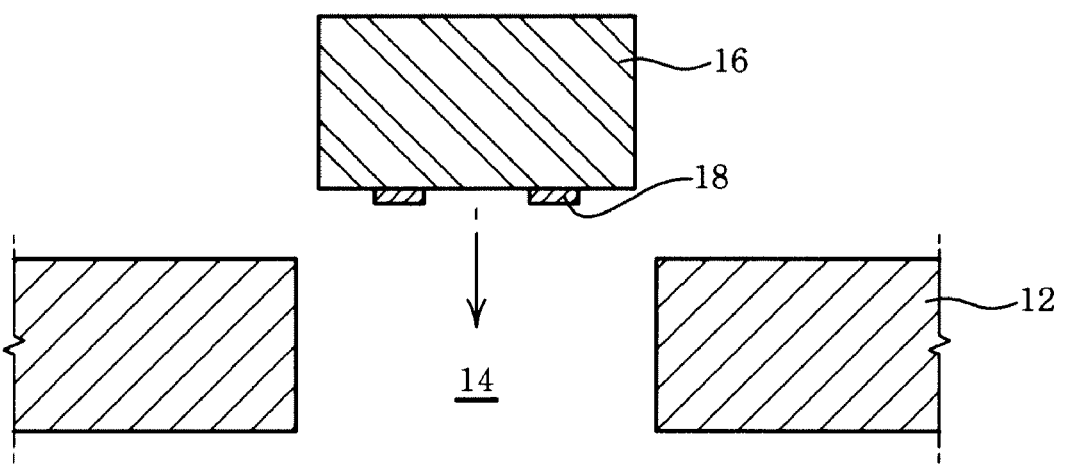
Figure 4:
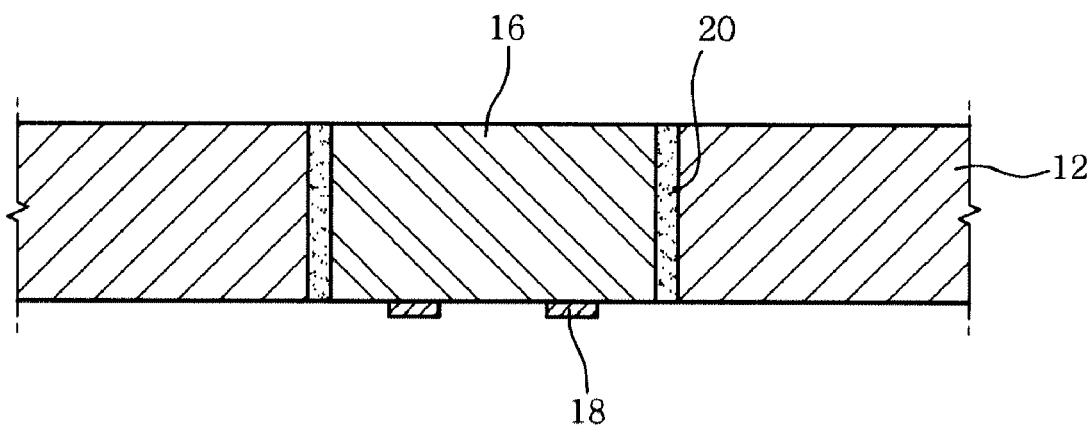
Figure 5:
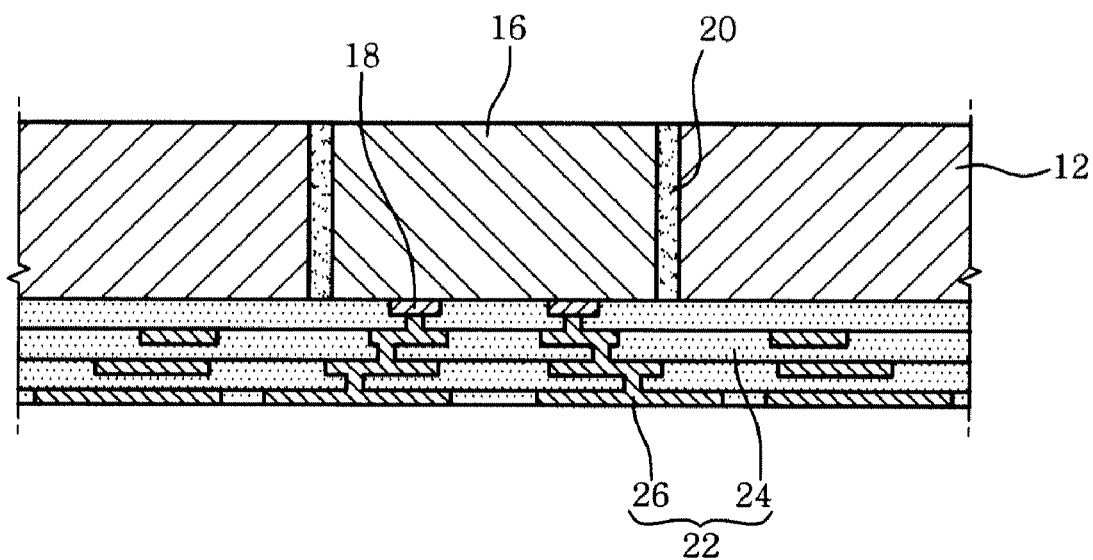
Figure 6:
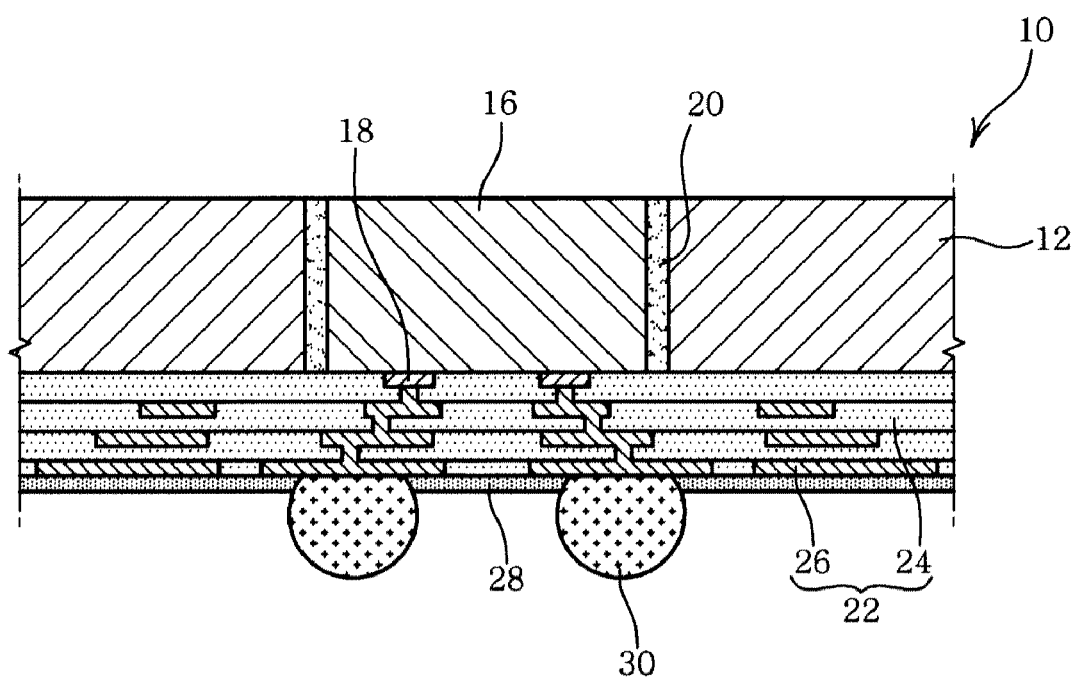

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to best describe the method he or she knows for carrying out the invention.

In the following detailed description, it should be noted that the terms "first", "second" and the like are not intended to indicate a specified amount, sequence or significance but are intended to differentiate constituent elements. Furthermore, in designation of reference numerals, it should be noted that the same reference numerals are used throughout the different drawings to designate the same or similar components. Also, in the description of the present invention, when it is considered that the detailed description of a related art may obscure the gist of the present invention, such a detailed description may be omitted.

Hereinafter, embodiments of the present invention will be described in greater detail with reference to the following drawings.

Wafer Level Package for Heat Dissipation

Figure 7:
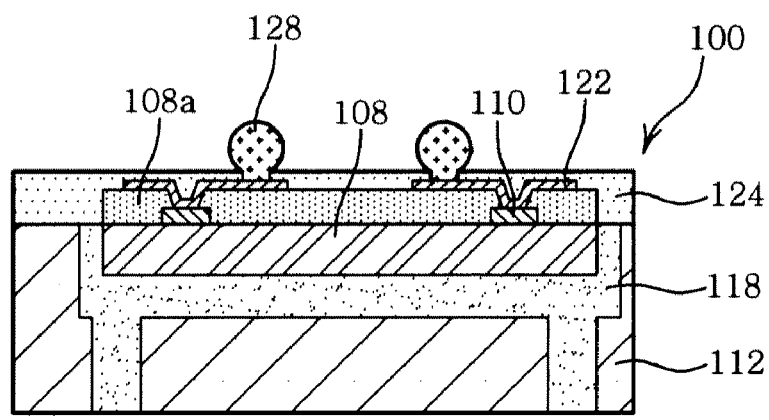
FIG. 7 is a cross-sectional view of a wafer level package for heat dissipation according to an embodiment of the present invention.

FIG. 7 is a cross-sectional view of a wafer level package for heat dissipation according to an embodiment of the present invention. Hereinafter, the wafer level package for heat dissipation 100 according to this embodiment of the present invention is described in detail.

As shown in FIG. 7, the wafer level package for heat dissipation 100 according to this embodiment of the present invention comprises a heat dissipation plate 112 having a cavity 114 and holes 116, a die 108 having pads which is mounted in the cavity 114 of the heat dissipation plate 112 in a face-up manner, a thermal conductive adhesive 118 charged between the die 108 and the inner wall of the cavity 114 and in the holes 116, and redistribution layers 122 connected to the pads 110 of the die 108.

At this point, the die 108 is mounted in the cavity 114 of the heat dissipation plate 112 with the thermal conductive adhesive 118 disposed therebetween. Consequently, heat generated from the die 108 is transferred to the heat dissipation plate 112 via the thermal conductive adhesive 118, thus realizing efficient heat dissipation.

In use, the wafer level package for heat dissipation 100 is subjected to thermal and mechanical stress. At this time, the holes 116 of the heat dissipation plate 112, which are filled with the thermal conductive adhesive 118, function to absorb the stress.

The holes 116 which are adapted to achieve the absorption of stress may be configured into various structures. The configuration of holes 116 will be described with reference to FIGS. 14 and 15.

Process of Manufacturing a Wafer Level Package for Heat Dissipation

Figure 8:
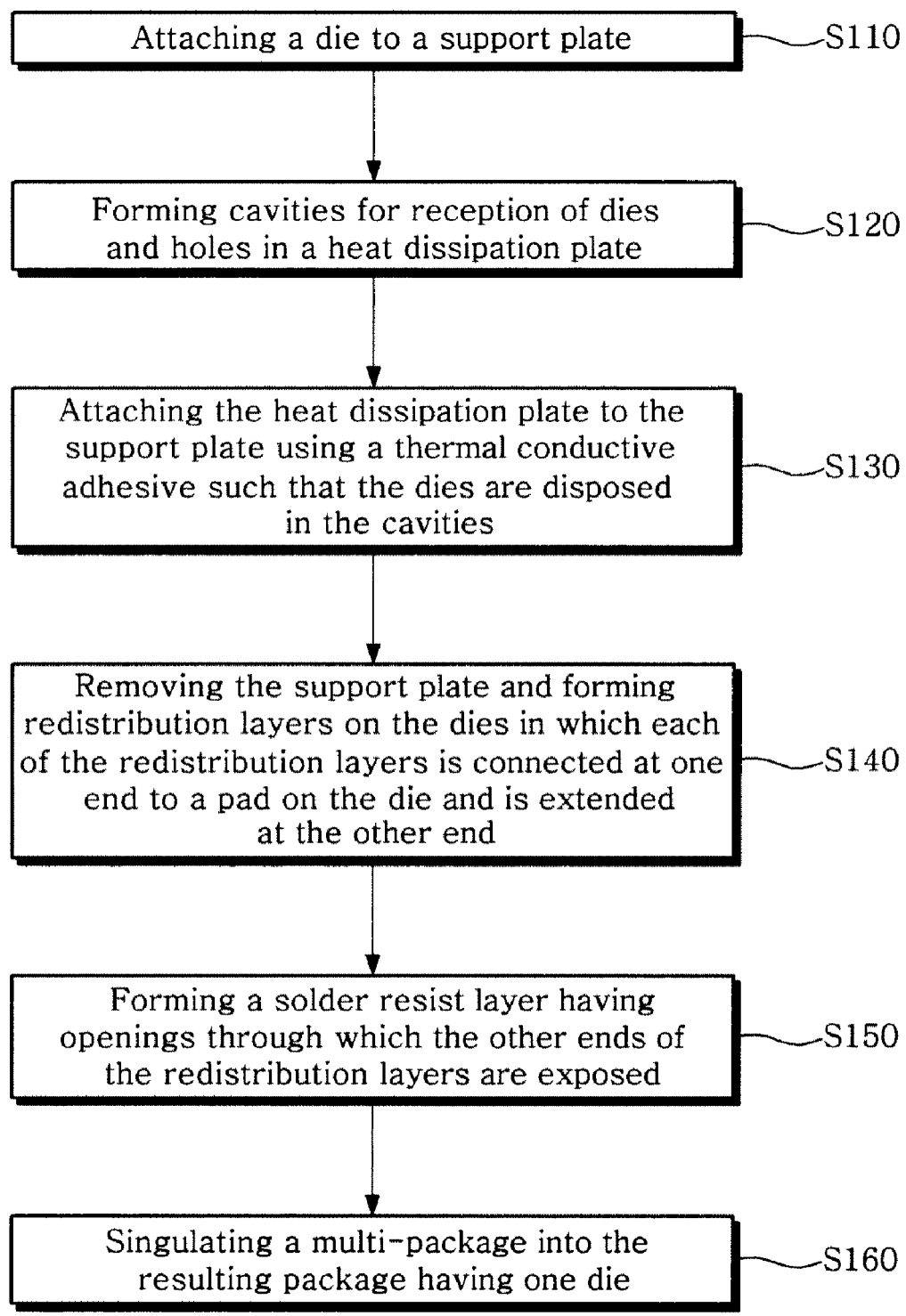
FIG. 8 is a flow chart showing a process of manufacturing a wafer level package for heat dissipation according to an embodiment of the present invention.

FIG. 8 is a flow chart showing a process of manufacturing a wafer level package for heat dissipation according to an embodiment of the present invention, and FIGS. 9 to 24 are cross-sectional views sequentially showing the process of manufacturing a wafer level package for heat dissipation according to the embodiment of the present invention.

As shown in FIG. 8, the process of manufacturing a wafer level package for heat dissipation according to the embodiment of the present invention comprises the steps of attaching a die to a support plate (S110), forming cavities for reception of dies and holes in a heat dissipation plate (S120), attaching the heat dissipation plate to the support plate using a thermal conductive adhesive such that the dies are disposed in the cavities (S130), removing the support plate and forming redistribution layers on the dies in which each of the redistribution layers is connected at one end to a pad on the die and is extended at the other end (S140), forming a solder resist layer having openings through which the other ends of the redistribution layers are exposed (S150), and singulating a multi-package into the resulting package having one die (S160). Hereinafter, the steps of the process will be described in detail with reference to drawings corresponding to the steps.

In the step (S110), dies 108 are attached to a support plate 102 in a face-down manner. FIGS. 9 to 12 are drawings which sequentially show this step (S110).

Figure 9:
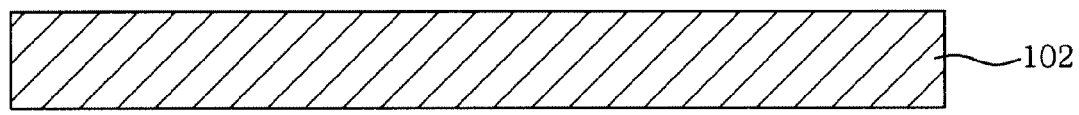
FIGS. 9 to 24 are cross-sectional views sequentially showing the process of manufacturing a wafer level package for heat dissipation according to the embodiment of the present invention.

As shown in FIG. 9, the support plate 102 is first prepared. The support plate 102 serves as a support in the manufacturing process and may be embodied as any plate as long as it has a predetermined strength.

Figure 10:
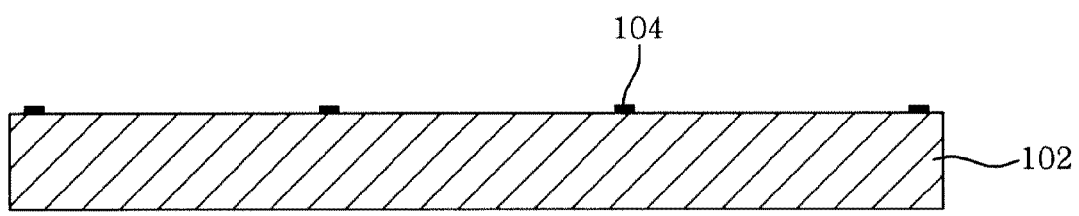

As shown in FIG. 10, alignment marks 104 are formed on the support plate 102 so as to improve an accuracy of die attachment. At this point, the alignment marks 104 are formed on one side of the support plate 102 on which the dies are attached.

Figure 11:
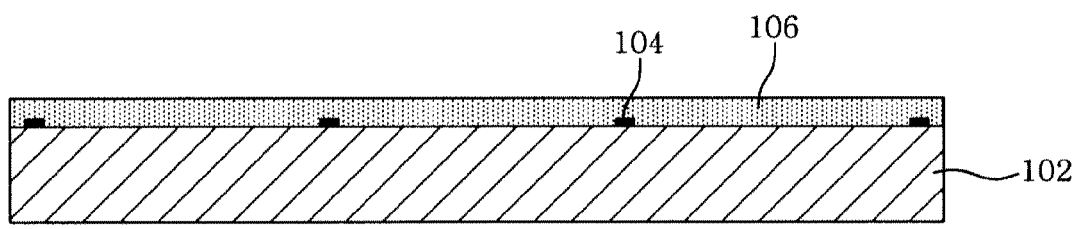

As shown in FIG. 11, a sacrifice layer 106 for die attachment is formed on the side of the support plate 102 on which the alignment marks 104 are formed.

The sacrifice layer 106, which fixedly holds the dies attached thereto, may be made of transparent semicured material, e.g., ceramic material, so as to allow recognition of the alignment marks 104 from above.

Figure 12:
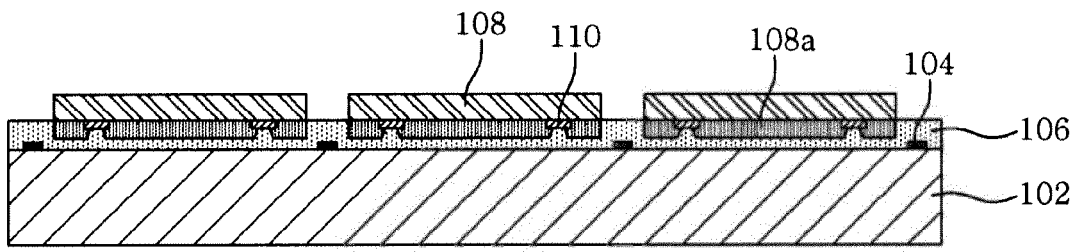

As shown in FIG. 12, the dies 108 are attached to the support plate 102.

In this regard, each of the dies 108 is configured in a manner such that a pad 110 is formed on a silicon chip body having an integrated circuit (not shown) incorporated therein such that it is electrically connected to the integrated circuit, and a passivation layer 108a is formed on the silicon chip body such that the pads 110 are exposed through the passivation layer 108a. The formation of the pads 110 and the passivation layer 108a may be realized by a fabrication (FAB) process.

At this point, the dies 108 can be fixedly attached to the support plate 102 by means of adhesivity of the sacrificed layer 106 in the semicured state.

The dies 108 are mounted on the support plate 102 using flip chip bonding such that the pads 110 of the dies 108 face downwards in a face-down manner. At this time, with the aid of the alignment marks 104 formed on the support plate 102, the dies 108 can be attached at desired positions, thus reducing errors in the attachment. Furthermore, since a plurality of dies 108 can be attached all together, a lead time for the attachment can be reduced.

Figure 13:
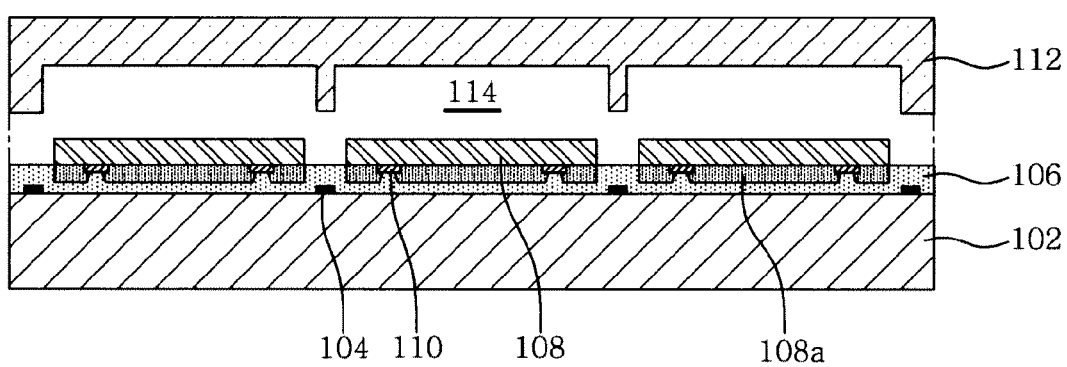
Figure 14:
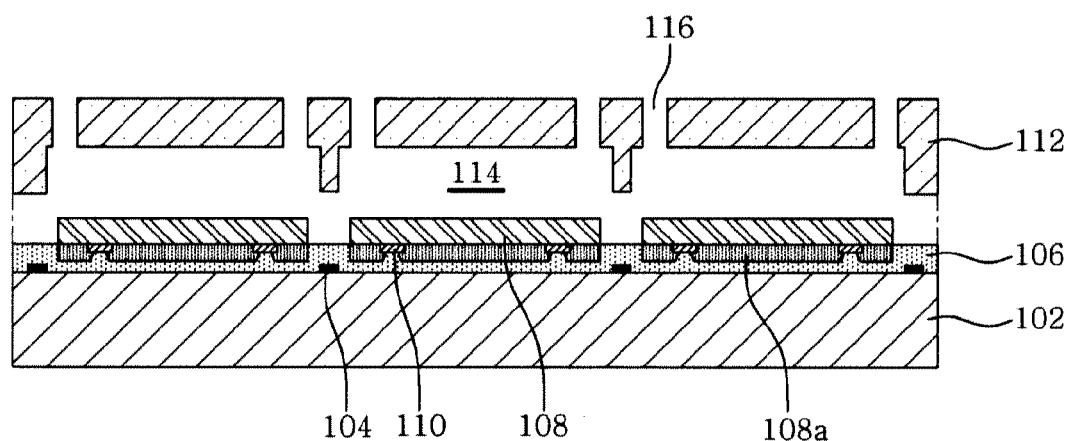
Figure 15:
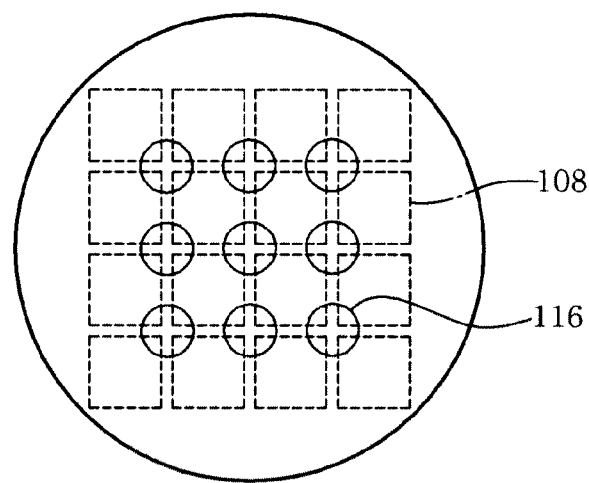

In the step (S120), cavities 114 for reception of the dies and holes 116 are formed in a heat dissipation plate 112. FIGS. 13 to 15 are drawings which sequentially show this step (S120).

As shown in FIG. 13, the heat dissipation plate 112 is first prepared, and the cavities 114 for reception of the dies are formed in the heat dissipation plate 112.

The heat dissipation plate 112 may be made of one selected from among stainless steel, iron (Fe), aluminum (Al), Nickel (Ni), magnesium (Mg), zinc (Zn), tantalum (Ta) and alloys thereof.

Each of the cavities 114 may be configured to have a width and a length greater than those of the die 108 such that the die 108 can be inserted in the cavity 114. The cavities 114 may be formed using various technologies such as an etching process or a mechanical etching process.

As shown in FIG. 14, the holes 116 are formed in the heat dissipation plate 112.

The holes 116 serve as absorber layers which absorb thermal and mechanical stress generated during operation of the wafer level package 100. In addition, when the dies 108 and the heat dissipation plate 112 are attached to the support plate 102 using a thermal conductive adhesive 118, the holes function to eliminate voids generated in the thermal conductive adhesive 118.

The holes 116 are formed through the heat dissipation plate 112, and each package unit which includes one corresponding die 108 may be provided with a plurality of holes 116. Although FIG. 14 shows two holes 116 formed at each package unit for the convenience of explanation, this is no more than one embodiment.

As shown in FIG. 15, the holes 116 are formed at locations where adjacent package units converge, so that one common hole 116 can be formed in four package units in one hole-forming operation. In other words, the hole can be formed at four corners of the heat dissipation plate 112 of each of the package units. When the hole 116 is formed in this manner, each of the package units is provided at four corners with a hole 116 that is divided into four sectors. More specifically, each of the hole sectors has a quadrangular section in which adjacent sides of the sector which correspond to a radius of the hole 116 define a right angle with respect to each other.

In this regard, the hole 116 may be formed on a scribing line so as to serve as the scribing line.

Figure 16:
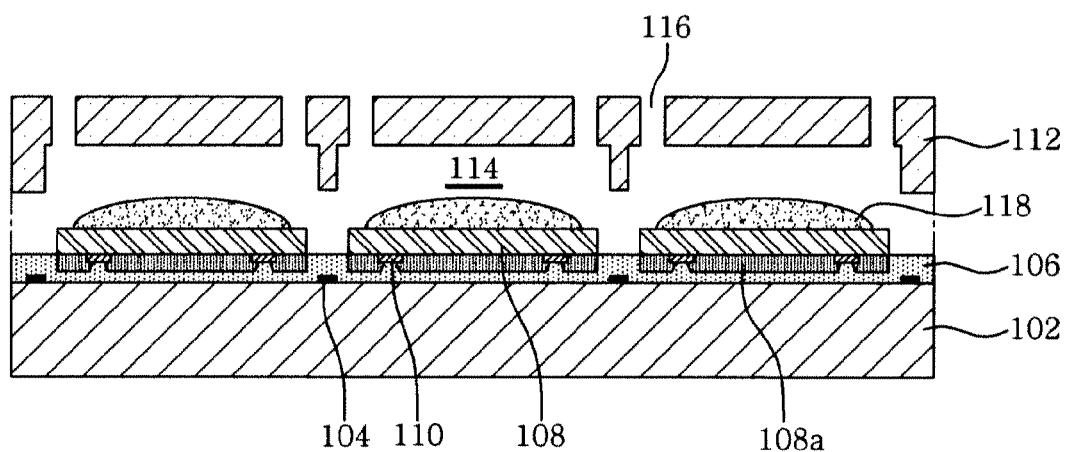
Figure 17:
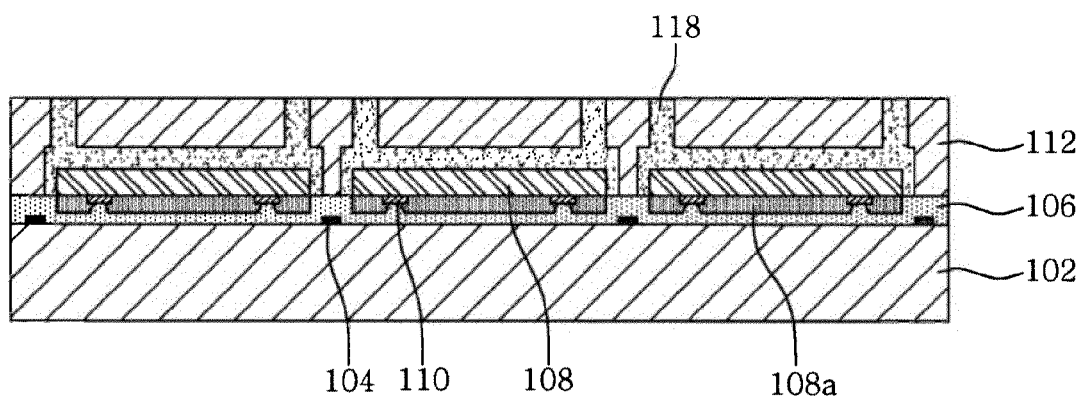
Figure 18:
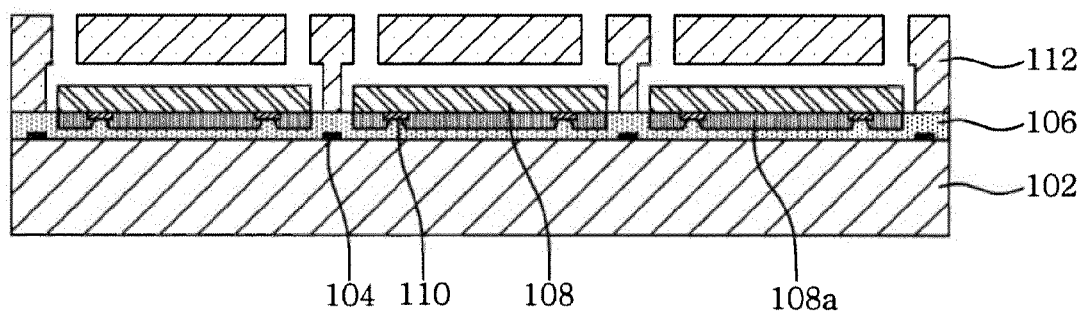
Figure 19:
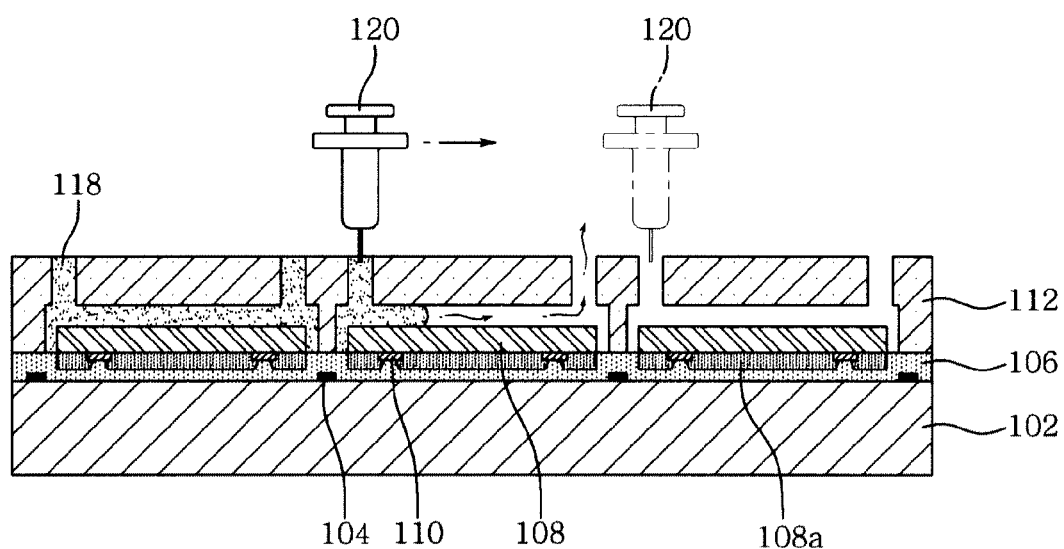

In the step (S130), the heat dissipation plate is attached to the support plate using a thermal conductive adhesive such that the dies are embedded in the cavities. FIGS. 16 and 17 are drawings which show a process according to an embodiment of this step, and FIGS. 18 and 19 are drawings which show a process according to another embodiment of this step.

A process according to one embodiment of this step will be described with reference to FIGS. 16 and 17.

As shown in FIG. 16, a thermal conductive adhesive 118 is applied onto the dies 108 so as to attach the heat dissipation plate 112.

At this time, the thermal conductive adhesive 118 may be applied onto the dies 108 through, for example, a dispensing process, and an application quantity of the thermal conductive adhesive may be determined taking volumes of the cavities 114 and the dies 108 into consideration. Specifically, the thermal conductive adhesive 118 is applied in an amount equal to the total volume of spaces between the inner walls of the heat dissipation plate 112 and inner walls of the cavities 114 and spaces of the holes 116 after the dies 108 are inserted in the respective cavities 114 of the heat dissipation plate 112.

As shown in FIG. 17, the heat dissipation plate 112 is aligned using the alignment marks 104 formed on the support plate 102 around peripheries of the dies 108 such that the dies 108 are precisely inserted in the cavities 114 of the heat dissipation plate 112. Subsequently, the heat dissipation plate 112 is attached to the support plate 102 using the thermal conductive adhesive 118.

At this point, the thermal conductive adhesive 118 infiltrates into spaces between the dies 108 and inner walls of the cavities 114 of the heat dissipation plate 112, i.e., spaces between lateral walls of the dies 108 and lateral walls of the heat dissipation plate 112, spaces between the upper surfaces of the dies 108 and a bottom surface of the heat dissipation plate 112, and spaces in the holes 116 of the heat dissipation plate 112, with the result that the heat dissipation plate 112 is attached to the support plate 102.

Next, a process according to another embodiment of this step will be described with reference to FIGS. 18 and 19.

As shown in FIG. 18, the heat dissipation plate 112 is preliminarily aligned with the support plate 102 using the alignment marks formed on the support plate 102 around peripheries of the dies 108 such that the dies 108 are precisely inserted in the respective cavities 114 of the heat dissipation plate 112.

As shown in FIG. 19, the thermal conductive adhesive 118 is applied into the holes 116 formed in the heat dissipation plate 112 using an injector 120, so that the spaces between the dies 108 and inner walls of the cavities 114 and spaces in the holes 116 are filled with the thermal conductive adhesive 118. As a result, the heat dissipation plate 112 is attached to the support plate 102.

At this point, in order to block generation of voids in the thermal conductive adhesive 118 injected through the holes 116, the thermal conductive adhesive 118 may be applied in such a way that the thermal conductive adhesive 118 is injected through one hole 116 while air in the spaces is discharged outside through the other holes 116.

Figure 20:
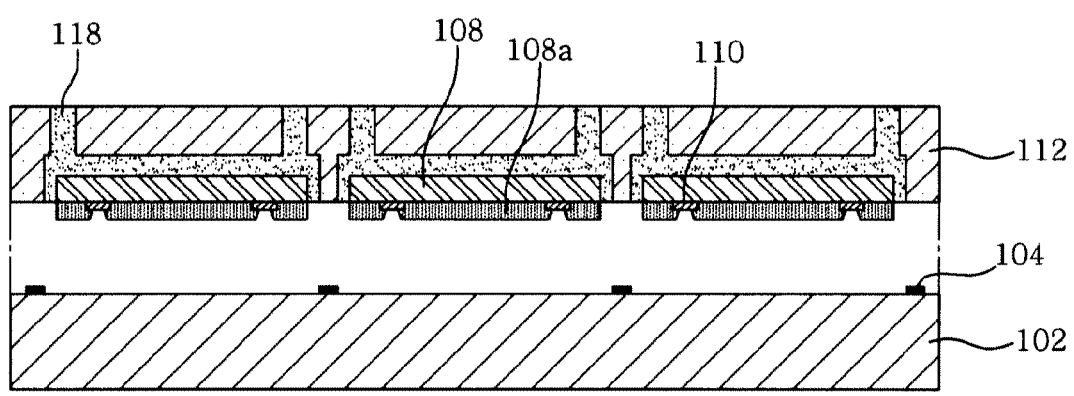
Figure 21:
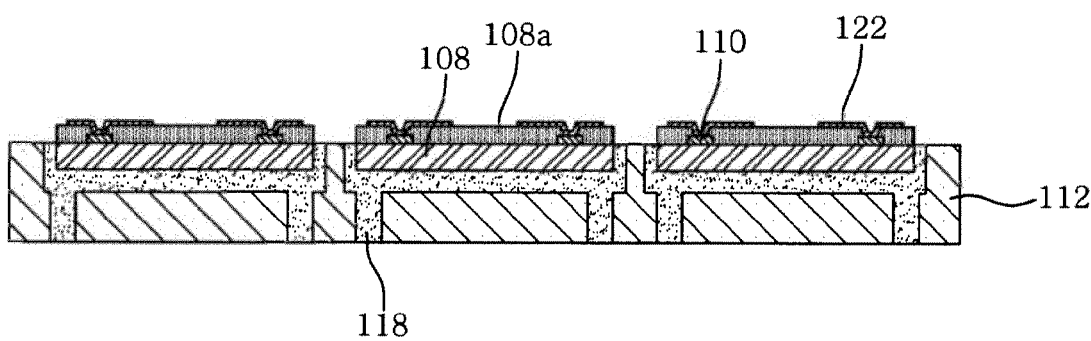

In the step (S140), the support plate is removed, and redistribution layers are formed on the dies such that one end of each of the redistribution layers is connected to the pad of the corresponding die and the other end of the redistribution layer is extended. FIGS. 20 and 21 are drawings which show a process corresponding to this step.

As shown in FIG. 20, the sacrifice layer 106 is eliminated so as to allow the support plate 102 to be separated from the heat dissipation plate 112.

As shown in FIG. 21, the redistribution layers 122 are formed on the dies 108 such that one end thereof is connected to the pad 110 and the other end thereof is extended through the passivation layer 108a. In this step, additional connection pads may be formed on the other ends of the redistribution layers 122.

Figure 22:
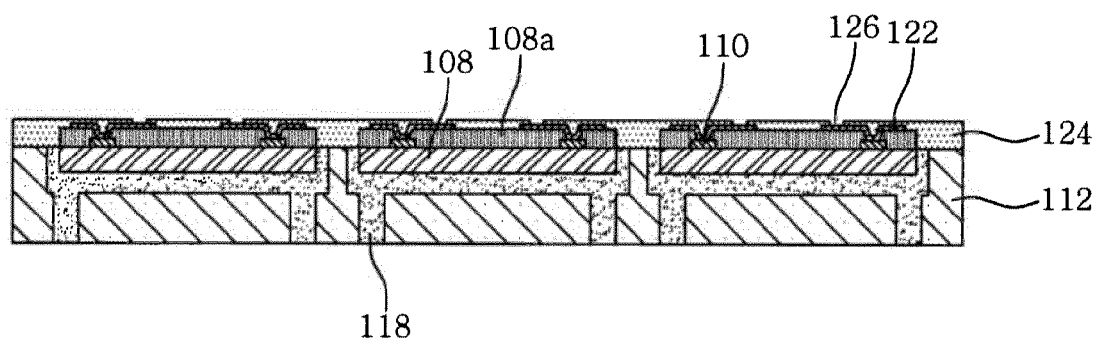

In the step (S150), a solder resist layer having openings through which the other ends of the redistribution layers 122 are exposed is formed. FIG. 22 is a drawing which shows a process corresponding to this step.

Figure 23:
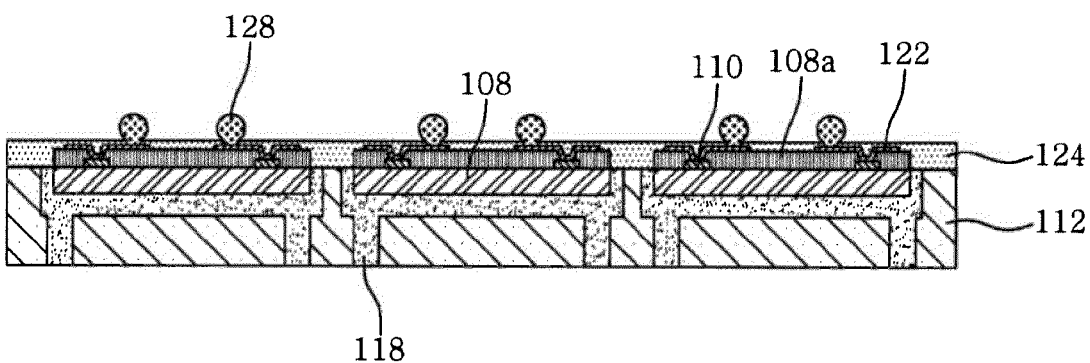

Since the other ends of the redistribution layers 122 serve as connection pads, the solder resist layer 124 is formed to protect the passivation layer 108a and the redistribution layers 122 except the other ends of the redistribution layers 122. In this step, external connection terminals 128 may be bonded to the other ends of the redistribution layers 122 which are exposed through the openings 126 of the solder resist layer 124, as shown in FIG. 23.

Figure 24:
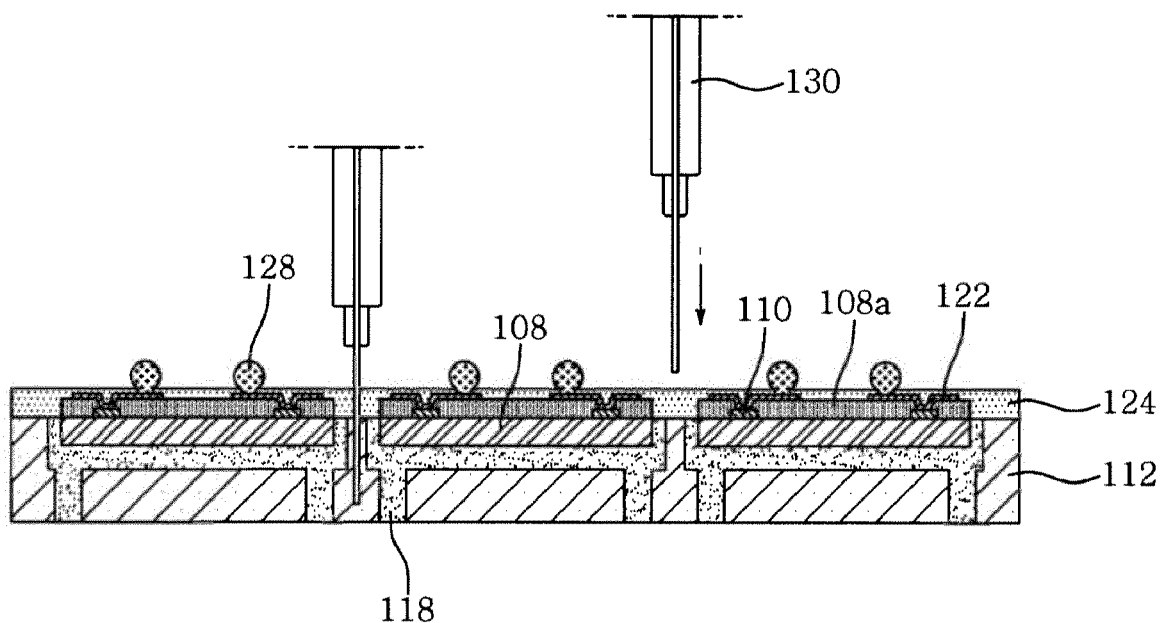

In the step (S160), the resulting product is separated into respective package units each having one corresponding die. FIG. 24 is a drawing which shows a process corresponding to this step. More specifically, the separation process is executed in such a way that the resulting package is diced along the scribing line using a dicing device 130, resulting in individual package units.

As described above, according to the present invention, the dies are mounted in the cavities of the heat dissipation plate, and thus back sides of the dies are protected from the outside.

Furthermore, since a height difference between the support plate and the heat dissipation plate are eliminated using the support plate, the redistribution layers can be formed without a separate insulating layer.

In addition, according to the present invention, the holes are formed in the heat dissipation plate so as to serve as absorber layers for absorbing thermal and mechanical stress and to minimize generation of voids in the thermal conductive adhesive.

Furthermore, since one hole is formed over four corners of package units, four package units can be filled with the thermal conductive adhesive by an injection process executed through only one hole.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A wafer level package for heat dissipation comprising:
   a heat dissipation plate including a cavity and a hole formed therein;
   a die including a pad disposed in the cavity of the heat dissipation plate in a face-up manner;
   a thermal conductive adhesive disposed between the die and an inner wall of the cavity and formed in the hole; and
   a redistribution layer connected at one end to the pad directly and which at the other end is extended,
   wherein the hole is formed in the cavity to penetrate the heat dissipation plate; and,
   the thermal conductive adhesive is formed to enclose the die.

2. The wafer level package for heat dissipation according to claim 1, further comprising:
   a solder resist layer formed on the die and having an opening through which the other end of the redistribution layer is extended; and
   an external connection terminal formed on the other end of the redistribution layer.

3. The wafer level package for heat dissipation according to claim 1, wherein the hole is formed through the heat dissipation plate.

4. The wafer level package for heat dissipation according to claim 1, wherein the hole includes a plurality of holes formed in the heat dissipation plate.

5. The wafer level package for heat dissipation according to claim 1, wherein the hole is formed at a periphery of the heat dissipation plate and has a sector section.

6. The wafer level package for heat dissipation according to claim 5, wherein the hole has a quadrangular section in which adjacent sides of the quadrant, which correspond to a radius of the hole, define a right angle with respect to each other.

* * * * *